United States Patent [19]
Kim et al.

[11] Patent Number: 4,982,249
[45] Date of Patent: Jan. 1, 1991

[54] DOUBLE DIFFUSED MOSFET CELL

[75] Inventors: Jong O. Kim, Seoul; Jin H. Kim, Chung-Buk, both of Rep. of Korea

[73] Assignee: Hyundai Electronic Industries Co., Ltd., Rep. of Korea

[21] Appl. No.: 364,262

[22] Filed: Jun. 9, 1989

[30] Foreign Application Priority Data

Jun. 27, 1988 [KR] Rep. of Korea .................... 88-7747

[51] Int. Cl.$^5$ .................... H01L 29/10; H01L 29/06; H01L 29/68; H01L 29/72
[52] U.S. Cl. .................... 357/23.4; 357/20; 357/23.8; 357/35; 357/80; 357/58; 357/48; 357/51; 357/23.6
[58] Field of Search .................... 357/23.4, 20, 23.8, 357/35, 80, 58, 48, 51, 23.6, 65

[56] References Cited

U.S. PATENT DOCUMENTS

| | | | |
|---|---|---|---|
| 4,376,286 | 3/1983 | Lidow et al. | 357/23.4 |
| 4,593,302 | 6/1986 | Lidow et al. | 357/23.4 |
| 4,642,666 | 2/1987 | Lidow et al. | 357/23.4 |
| 4,651,181 | 3/1987 | David | 357/23.4 |
| 4,680,853 | 7/1987 | Lidow et al. | 29/571 |
| 4,705,759 | 11/1987 | Lidow et al. | 437/29 |
| 4,810,665 | 3/1989 | Chang et al. | 357/23.4 X |
| 4,823,176 | 4/1989 | Baliga et al. | 357/23.4 |

FOREIGN PATENT DOCUMENTS 0130508  1/1985  Japan .................... 357/23.4

Primary Examiner—Rolf Hille
Assistant Examiner—Roy Potter

[57] ABSTRACT

A double diffused MOSFET cell having a particular cell configuration which resembles a circle with a scalloped perimeter is disclosed.

6 Claims, 2 Drawing Sheets

OPENING IN GATE OXIDE

FIG. 2A
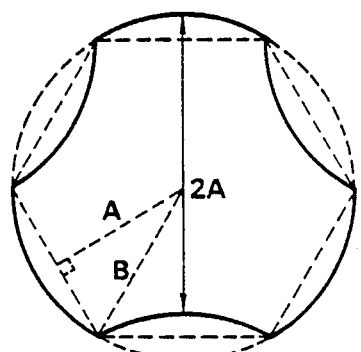
FIG. 2B
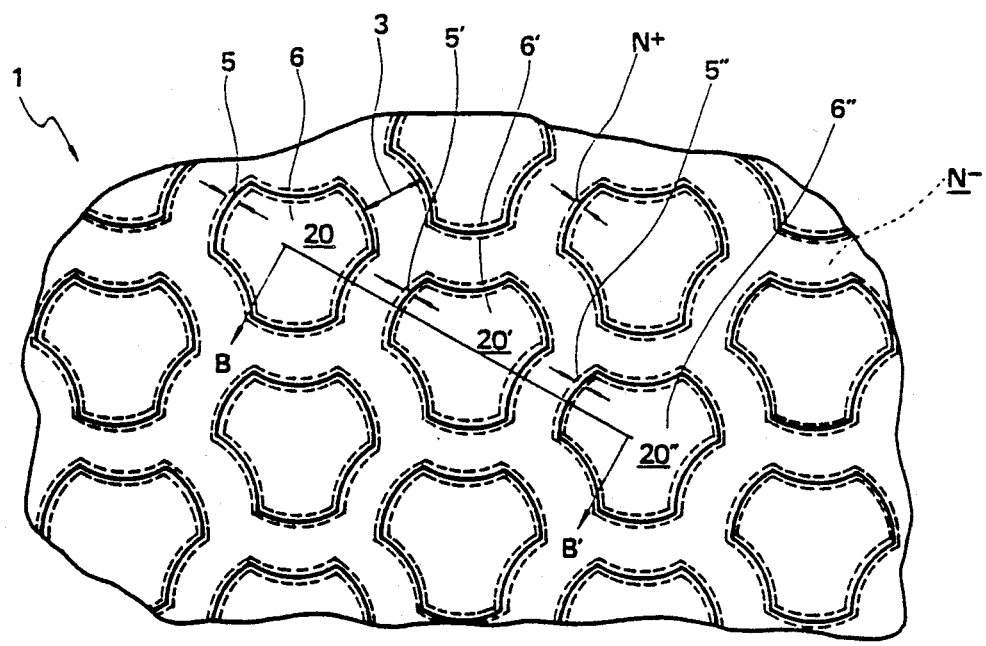
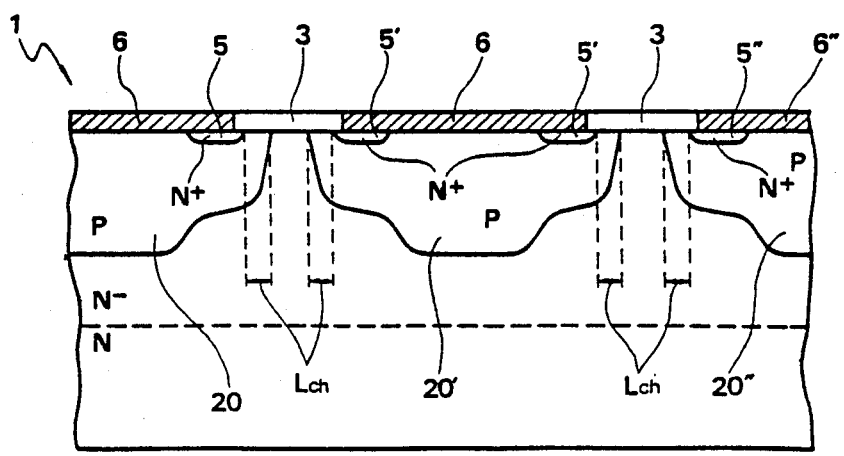
FIG. 2C

DOUBLE DIFFUSED MOSFET CELL

BACKGROUND OF THE INVENTION

This invention is based on a Korean Patent Application No. 88-7747, filed on Jun. 27, 1988, the disclosure of which is expressly incorporated herein as if fully set forth herein.

1. Field of the Invention

This invention relates to a D MOSFET (Double - Diffused MOSFET) cell, and more particularly to an advanced D MOSFET cell structure which increases the cell channel width per unit area, that is, the width of the current path, and improves the current transfer capability of the device retaining the same integration capacity per unit area.

2. Information disclosure statement

In general, the channel width means the channel distance that is perpendicular to the channel length as shown in FIG. 1B. For example, in U.S. Pat. No. 4,593,302, entitled "Process for manufacture of high power MOSFET with laterally distributed high carrier density beneath the gate oxide" by A. Lidow et al. and assigned to International Rectifier, the cell structure is hexagonal in shape.

Also, according to IEEE ED-28, No. 9, PP. 1099, Sept. 9, 1981 the cell structure may be hexagonal, square, or triangular in shape.

In these prior art cell structures, since the current transfer capability is proportional to the channel width formed by the gate electrode, the integration capacity of the cell structure decreased with the same chip size and the current transfer capability of the device was limited.

Therefore, it is an object of the present invention to provide a D MOSFET cell which increases the allowed current capacity by extending the channel width and increasing the integration capacity by improving the prior art cell structure.

BRIEF SUMMARY OF THE INVENTION

The cell structure according to the present invention is formed by a P-type diffusion region in a N-epitaxial layer on a N-type silicon substrate. In the preferred embodiment, the P-type diffusion region has a shape in which a circle is circumscribed to the hexagon and the radius of the circle is one side length of the hexagonal cell, and alternatively spaced three sides are formed by the circumscribing circumference and another three sides are formed by symmetrizing the circumscribing circumference to each sides of the hexagon. A D MOSFET cell according to the present invention comprises a N-type silicon substrate with a N- epitaxial layer formed on the N-type silicon substrate. A P-type diffusion region is formed in the N-epitaxial layer, to the desired depth. The P- type diffusion region has a circular structure with a plurality of concave arcs and a plurality of convex arcs positioned about the circular structure to define a circle having a scalloped perimeter.

A N+ region having a constant width is formed along the scalloped perimeter of the P- type diffusion region. A metal layer is formed and extends to the scalloped perimeter of the circle. A gate oxide layer extends from the scalloped perimeter of the metal layer and is formed over the P- type diffusion region and the N- type epitaxial layer.

Preferably, the number of concave arcs is three and the number of convex arcs is three with each arc having an equal length, thereby forming a symmetrical scalloped perimeter P-type diffusion region.

The shaped N+ region which is spaced inward to the desired distance along the inside of the structured P-type diffusion region, increases the total channel width of the cell formed in perpendicular in the P-type diffusion region between the N+ region and N-epitaxial layer. The cell structure according to the invention also has many advantages which can be widely applied to VDMOS (Vertical Double-diffused MOS), LDMOS(-Lateral Double-diffused MOS), and IGBT(Insulated Gate Bipolar Transistor) and others. The cell structure also improves the current transfer capability of the device within the same chip size per unit area.

The cell of the present invention may be described as a conventional cell save for its unique scalloped circular shape of the P-type diffusion region which enables an increased cell integration capacity and channel width per unit area. Conventional manufacturing techniques are used to form the cell or a plurality of cells according to the invention.

BRIEF DESCRIPTION OF THE DRAWINGS

For a fuller understanding of the nature and objects of the invention, reference should be had to the following detailed description taken in connection with the accompanying drawings in which:

FIG. 2A is a Double diffused MOSFET cell according to the present invention;

FIG. 2B is a top view of cell of the present invention integrated on the N-type wafer; and FIG. 2C is a cross-section of FIG. 2B taken along line B—B'.

DETAILED DESCRIPTION OF THE DRAWINGS

Figure 1A:
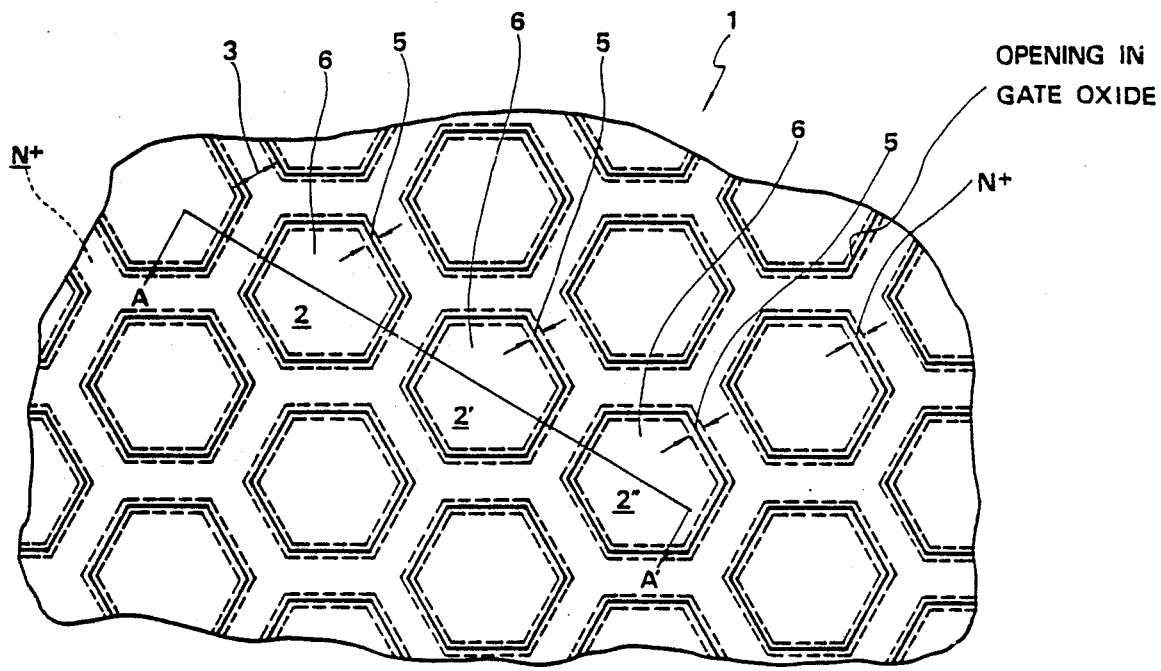
FIG. 1A is a cross-sectional view of a prior art hexagonal cell on a N-type wafer.

FIG. 1A is a plan view which is regularly disposed and normally spaced to the desired distance, and symmetrically to the lateral direction of the prior art hexagonal cell 2, 2' and 2" on the N-type wafer 1. The inside of the regular hexagon is a P-type diffusion region, not shown in FIG. 1A, which is disposed with alternative spacing between the insulation layer or gate oxide layer 3 outside that region and N-diffusion region inside that region. The N+diffusion region (5, 5', 5") is formed in the hexagonal cell 2, 2' and 2" of the P-type diffusion region having hexagonal ring shape spaced inward to the desired distance along the inside of said P-type diffusion region, as will be described in FIG. 1B. Therefore, the solid line of each cell with a regular hexagon depicts the opening of the gate oxide layer for the gate electrode, and the insulation layer of the regular hexagon which remained after the formation of the opening of a regular hexagon will be a gate oxide layer 3 of the device 1.

Figure 1B:
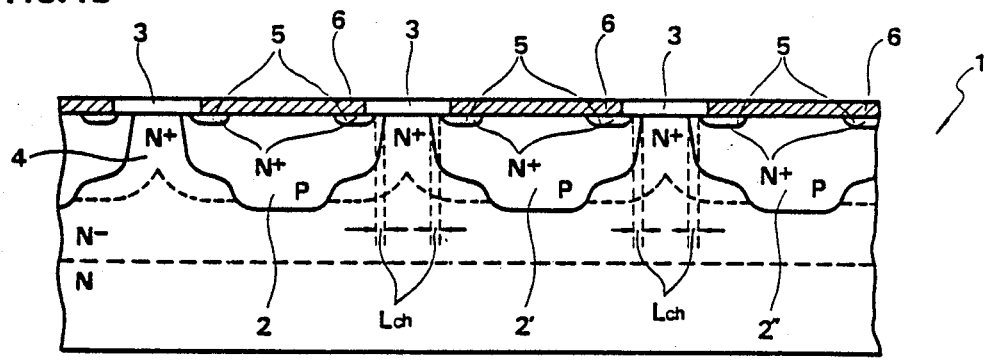
FIG. 1B is a cross-section of FIG. 1A taken along line A—A'.

FIG. 1B is a cross-section of FIG. 1A taken along section line A—A' of FIG. 1A. After the formation of the N-epitaxial layer on the N-type wafer 1, hexagonal P-type region 2, 2' and 2" in the N-epitaxial layer is formed, N+ diffusion region 5, 5' and 5" along the perimeter of the P-type region 2, 2' and 2" is formed, and metal 6, 6′ and 6″ is contacted with the each N+ diffusion region 5, 5′ and 5″.

The next process is to form hexagonal cell structure as shown in FIG. 1A in which n+ region 4 is formed between this p-type diffusion region 2, 2′, and 2″ to the desired depth. Then, gate oxide layer 3 over the upper surface of this n+ region 4 is formed to increase forward on-resistance, and this is one of the features of the prior fabrication method. Thus, in this structure, the channel length formed by gate electrode is LCH as shown in FIG. 1B.

Figure 1C:
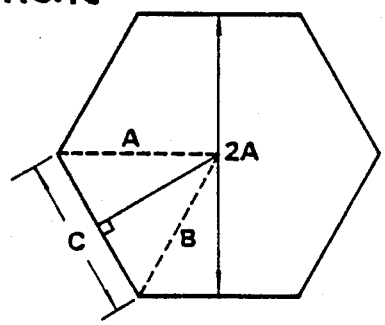
FIG. 1C is a hexagonal cell of FIG. 1A.

FIG. 1C shows an enlarged view of the hexagonal cell of FIG. 1A. When it is estimated that the channel width of current transfer path is perpendicular to the channel length, the distance between the center of the hexagon and one sided edge is "A", and the length of side "B" is $$B = A/\cos 30° = A/\frac{\sqrt{3}}{2} = \frac{2}{\sqrt{3}} A \quad (1)$$

Thus, the length of side "C" satisfies following equation from Pythagoras theorem.

$$\left(\frac{2}{\sqrt{3}} A\right)^2 - (A)^2 = \left(\frac{C}{2}\right)^2, \quad (2)$$

$$\frac{1}{3} A^2 = \frac{C^2}{4} \text{ or } C = \frac{2}{\sqrt{3}} A$$

Thus, the total channel width, Wch1, of hexagon is $$Wch\ 1 = \frac{2}{\sqrt{3}} A \times 6 = \frac{12}{\sqrt{3}} A \quad (3)$$

Figure 1D:
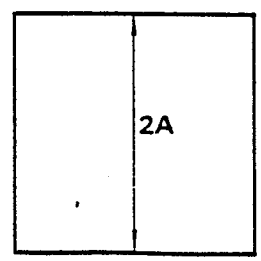
FIG. 1D is a prior other shaped square cell.

On the other hand, FIG. 1D shows prior art square cell structure.

Because this shape is square and the width of each sides is 2A, the total channel width Wch 2 is $$Wch\ 2 = 2A \times 4 = 8A \quad (4)$$

But, even if the channel width of the prior art square is larger than that of the hexagon in the cell with the same center width, there is still a limit to decrease the integration capacity within the same chip size.

FIG. 2A shows cell structure of the present invention. In order to increase the cell integration capacity and the total cell channel width per unit area, the scalloped circular shape is, as shown, formed in the each side of prior art regular hexagonal cell.

That is, a circle is drawn to circumscribe to the regular hexagon. Alternatively spaced three sides are formed by the circumscribing circumference and another three sides are formed by symmetrizing the circumscribing circumference to each sides of the hexagon.

Therefore, the total channel length Wch3 of the ring-type cell structure from present invention is nearly same as that of the circumference. Here, the central width of the cell of FIG. 2A is 2A as shown in FIG. 1C and radius B is $$\frac{2}{\sqrt{3}} A$$

from eq. (1). Thus, from the cell structure of the present invention, the total channel width Wch3 is $$Wch\ 3 = 2\pi\gamma = 2\pi \frac{2}{\sqrt{3}} A = \frac{4}{\sqrt{3}} \pi A \quad (5)$$

Here, 2A is central width of the cell, $\pi$ is 3,1415927.

FIG. 2B is the plan view of the device 1 in which a plurality of the cells 20, 20′ and 20″ formed by the present invention are integrated and disposed on the N-type wafer. The N+ diffusion region 5, 5′ and 5″ of the source electrode is formed on the upper surface of the P-type diffusion region. The gate oxide layer 3 is formed between the solid lines of each cell, and the metal 6, 6′ and 6″ is formed in the solid line on the cell 20, 20′ and 20″.

FIG. 2C is an enlarged cross-section of FIG. 2B taken across the section line of B—B′ in FIG. 2B. Referring to FIG. 2C, N-epitaxial layer 1 is formed on the N-type wafer and P-type diffusion region 20, 20′ and 20″ is formed shown in the cell structure, i.e., in the form of a scalloped circle, by the present invention such as explained in FIG. 2A. Thereafter, a circle having a scalloped perimeter shape N+diffusion region 5, 5′ and 5″ is formed along the inside of each lateral side (arc) of the P-type diffusion region 20, 20′ and 20″ respectively, and each of the N+ diffusion region 5, 5′ and 5″ is contacted with metal 6, 6′ and 6″, respectively, and then, the insulation layer or oxide layer 3 for the gate electrode between the metals 6, 6′ and 6″ forms the shape of FIG. 2B. Referring to the operation of the vertical D MOSFET formed by the present invention, the lower part of the N-type region of FIG. 2C is connected to drain electrode but is not shown, and N+ region 5, 5′ and 5″ formed inside the lateral side (arc) of the each P-type region 20, 20′ and 20″ on the upper part is connected to source electrode with metal 6, 6′ and 6″, respectively. Also, the scalloped circle shaped oxide layer 3 which is formed over the N-region between the P-type region 20 and the other P-type 20′ serves as the oxide layer of the gate electrode.

Thus, since the channel Length (LCH) in the P-type region 20, 20′ and 20″ between N+ region 5, 5′ and 5″ and N region is formed by gate electrode existing over the oxide layer 3, the current flows from drain electrode to source electrode.

As described above in detail, according to the present invention it is possible to improve the current transfer capability by increasing the channel width, that is, the current transfer path, and channel width ratio of FIG. 1C to FIG. 2A can be represented as a percentage from eq.(3) and eq.(5)

$$\frac{\text{channel width of the present invention-channel width of prior hexagon}}{\text{channel width of the prior hexagon}} \times 100 = \quad (6)$$

-continued $$\frac{\left(\frac{4}{\sqrt{3}}\pi - \frac{12}{\sqrt{3}}\right)A}{\frac{12}{\sqrt{3}}A} \times 100 = 5\%$$

That is, according to the cell structure of the present invention, the channel width is larger by about 5% than that of the prior art hexagonal cell structure as shown above eq.(6).

This shows that current transfer capability is increased as much, while retaining the equal integration capacity to the prior art hexagonal cell structure.

If the cell structure formed by the present invention is applied to other semiconductor devices such as VMOS, LDMOS, IGBT, besides the VDMOS explained above, it improves transfer capability of the device and has high current density by increasing the channel width, or circumference length of the cell per unit area in the same chip size over the prior art cell structure, resulting in many advantages such as ease of current design in which semiconductor device design and fabrication flowing large current is necessary.

Here, it should be noted that the invention has been described in connection with the application of VD MOSFET cell, and clearly the invention is also applicable to semiconductor devices such as LDMOS, VMOS, IGBT and to other semiconductor devices as described above.

The present disclosure includes that contained in the appended claims as well a that of the foregoing description. Although this invention has been described in its preferred form with a certain degree of particularly, it is understood that the present disclosure of the preferred form has been made only by way of example and that numerous changes in the details of construction and the combination and arrangement of parts may be resorted to without departing from the spirit and scope of the invention.

What is claimed is:

1. A D MOSFET cell comprising a N-type epitaxial layer on the N-type silicon substrate, a P-type diffusion region of hexagonal cell formed in the N-type epitaxial layer to the desired depth, ring shaped N+ region with constant width formed along the perimeter in said P-type diffusion region, a channel formed in P-type diffusion region between N+ region and N-type epitaxial layer by gate voltage; characterized in that, said P-type diffusion region has a structure that alternatively spaced three sides are formed by the circumscribing circumference and another three sides are formed by symmetrizing the circumscribing circumference to each sides of the hexagon; and the total channel width of the cell is increased so that said N+ region formed in said P-type diffusion region having ring shape spaced inward to the desired distance along the inside of said P-type diffusion region.

2. The device of claim 1 which is further characterized in that a plurality of cells are disposed for large scale integration of said cell structure; the concave and convex parts of the circumscribing and inscribing sides of the said the plurality of cells are disposed on every direction with continuous pattern while retaining constant distance.

3. A semiconductor device formed by a plurality of cells as set forth at claim 1.

4. A D MOSFET cell comprising: a N-type silicon substrate, a N-epitaxial layer formed on said N-type silicon substrate, a P-type diffusion region formed in said N- epitaxial layer to the desired depth having a circular structure with a plurality concave arcs and a plurality of convex arcs alternately positioned about said circular structure to define a circle having a scalloped perimeter; a metal layer formed on said N- epitaxial layer and extending to said scalloped perimeter of said circle; a N+ region having a constant width formed along said scalloped perimeter of said P- type diffusion region; and a gate oxide layer extending from said scalloped perimeter of said metal layer and formed over said P type diffusion region and said N- type epitaxial layer.

5. The D MOSFET cell of claim 4 wherein the number of concave arcs is three and the number of convex arcs is three and wherein each arc has an equal length relative to another arc thereby forming a balanced circle shape having a symmetrical scalloped perimeter.

6. The D MOSFET cell including a plurality of intergrated D MOSFET cells of claim 1.

* * * * *